United States Patent [19]

Leonov et al.

[11] Patent Number: 4,976,002
[45] Date of Patent: Dec. 11, 1990

[54] TUBE PARTICLE VACUUM CLEANER

[75] Inventors: Mark Leonov; Roy de Groot, both of Santa Clara, Calif.

[73] Assignee: Intel Corporation, Santa Clara, Calif.

[21] Appl. No.: 279,412

[22] Filed: Dec. 2, 1988

[51] Int. Cl.$^5$ ................................................ B08B 9/02
[52] U.S. Cl. ...................................... 15/304; 15/315; 15/395
[58] Field of Search .......................... 15/304, 315, 395

[56] References Cited

U.S. PATENT DOCUMENTS

| | | | |
|---|---|---|---|
| 1,475,989 | 12/1923 | Easterday | 15/304 X |
| 1,661,931 | 3/1928 | Dolan | 15/312 R X |
| 1,831,099 | 11/1931 | Densmore | 15/395 |
| 1,869,730 | 8/1932 | Antle | 15/395 X |
| 1,994,616 | 3/1935 | Leitzell | 15/395 X |
| 2,193,999 | 3/1940 | Allen | 15/304 X |
| 2,251,739 | 8/1941 | Huntsinger | 15/395 X |
| 2,789,296 | 4/1957 | Cheadle | 15/304 X |

FOREIGN PATENT DOCUMENTS 1062393 3/1967 United Kingdom ................. 15/304

Primary Examiner—Chris K. Moore
Attorney, Agent, or Firm—Blakely, Sokoloff, Taylor & Zafman

[57] ABSTRACT

The present invention overcomes the aforementioned difficulties by providing a vacuum device to clean the interior surface of particle tubes used in the manufacture of semiconductor wafers. The vacuum device consists of a head which is designed to closely fit with the interior surface of the particle tube to be cleaned. Guide wheels are provided to align the head with the particle tube and to allow the vacuum device to easily roll in and out of the particle tube. The wheels are made of material which does not scratch the interior surface of the particle tube. The head is attached to vacuum tubing by means of flexible bellows. The vacuum tubing and head may be rotated to allow the head to clean the entire interior surface of the particle tube.

15 Claims, 3 Drawing Sheets

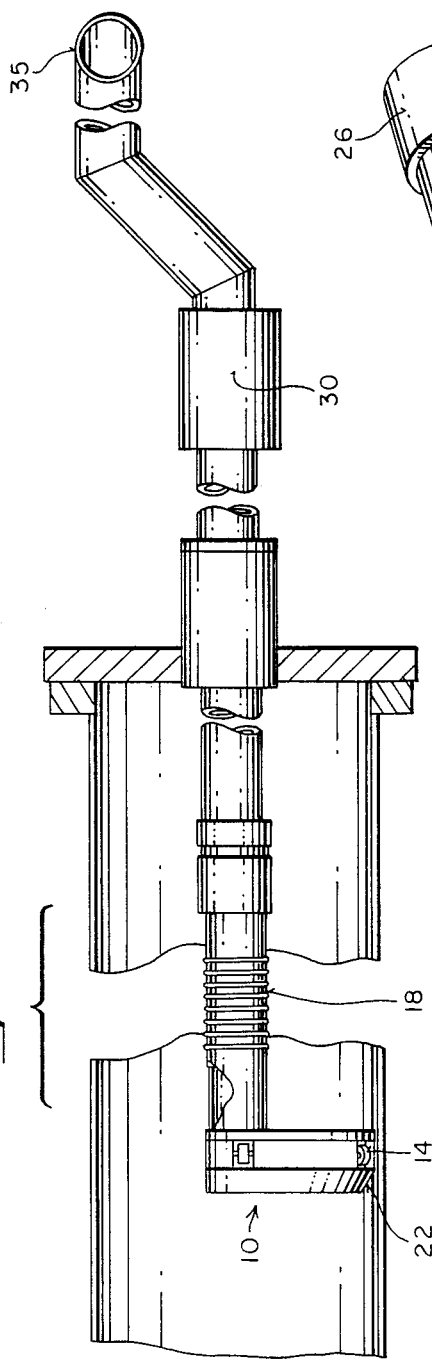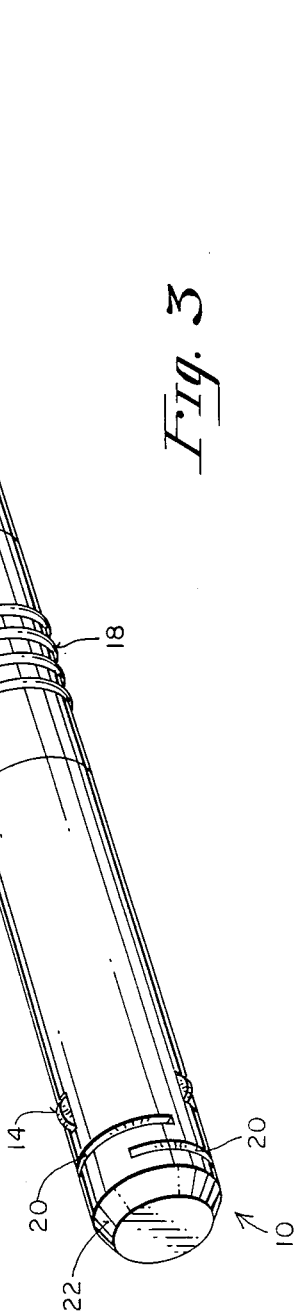

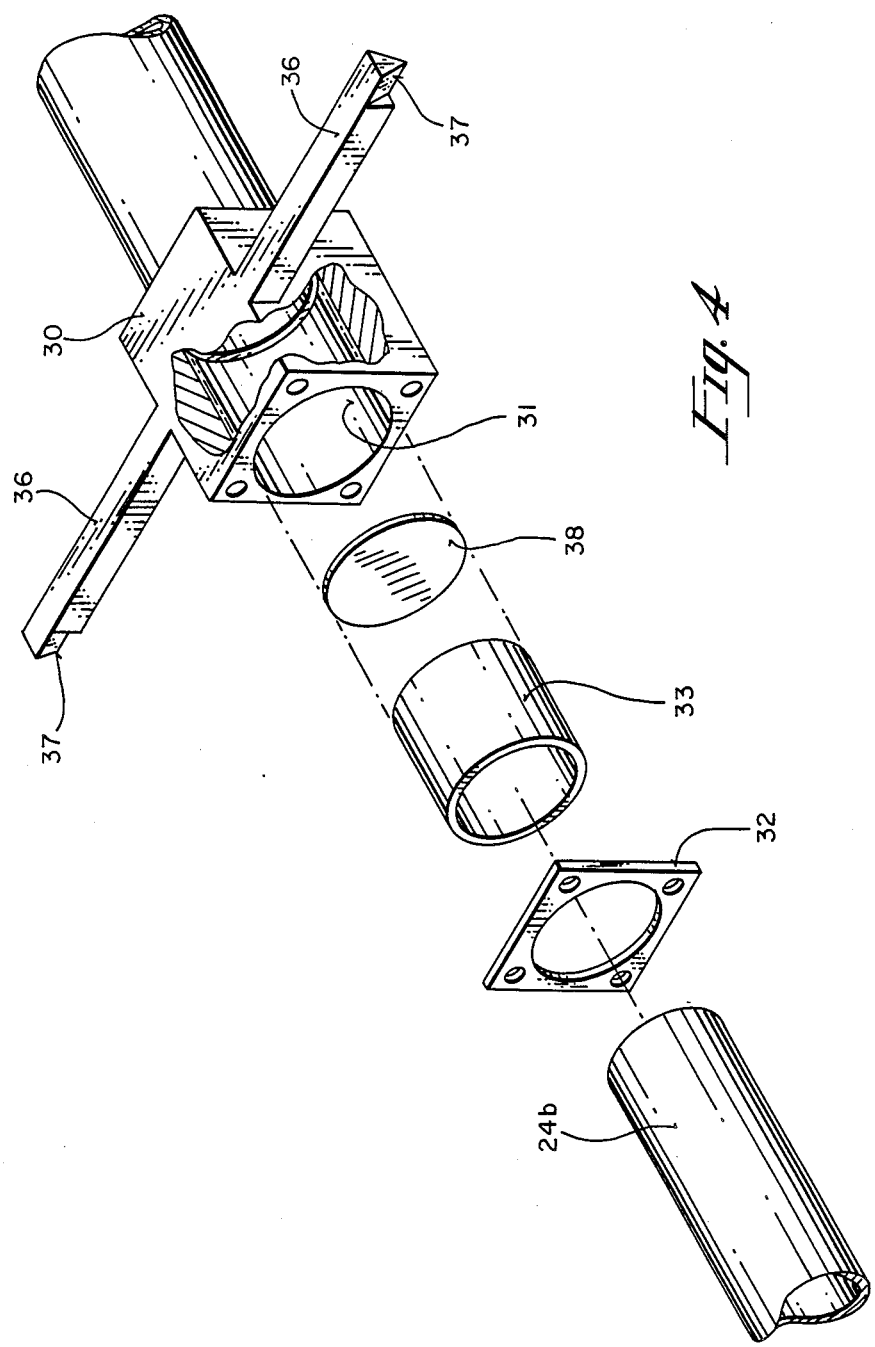

TUBE PARTICLE VACUUM CLEANER

FIELD OF THE INVENTION

This invention relates to the field of industrial vacuum cleaners and, more particularly, to a vacuum cleaner for the inside surface of particle tubes used in the manufacture of semiconductor devices.

BACKGROUND OF THE INVENTION

In the semiconductor field, integrated circuits are manufactured from large pieces of semiconductor material commonly known as wafers. The wafers have deposited on them various layers of conducting and non-conducting material. These layers are each separately deposited on the wafer as it is built up in a step-by-step process. The layers can be applied to the wafer using any one of several methods which are well known in the art.

One of these well-known deposition methods involves surrounding the wafer with a gas containing the desired material to be deposited on the wafer. The wafer and the gas are oppositely charged, and the material is electrically attracted to the wafer. This process is usually carried out within a sealed tube. One disadvantage of this process is that all of the material in the gas does not necessarily become attached to the wafer. As a result, some of the material settles onto the bottom of the tube. This extra material can later become mixed in with the material in the gas. The amount of suspended material is carefully controlled so that a precise amount will be evenly deposited on the wafer. Any accumulation of material within the tube is highly undesirable as it may eventually become depositised on the wafers. To prevent this accumulation, the tubes must be periodically removed and cleaned. However, removal of the tubes results in a loss of production time, thus adding to the cost of manufacturing the wafers. Also, the tubes used in the semiconductor manufacturing process are often made of a brittle material, such as quartz. When a quartz tube is removed, there is a risk that the tube may be broken. Moreover, the process of depositing a substrate material onto the wafers is usually conducted at a high temperature. Additional down time and cost are incurred in allowing the tube to cool before it is cleaned and in reheating the tube before it can be used again.

SUMMARY OF THE INVENTION

The present invention overcomes the aforementioned difficulties by providing a vacuum device to clean the interior surface of manufacturing tubes used in the manufacture of semiconductor wafers. The vacuum device consists of a head which is designed to closely fit with the interior surface of the manufacturing tube to be cleaned. Guide wheels are provided to align the head with the manufacturing tube and to allow the vacuum device to easily roll in and out of the manufacturing tube. The wheels are made of material which does not scratch the interior surface of the manufacturing tube. The head is attached to vacuum tubing by means of flexible bellows. The vacuum tubing and head may be rotated to allow the head to clean the entire interior surface of the manufacturing tube.

BRIEF DESCRIPTION OF THE DRAWINGS

FIG. 2 illustrates the vacuum device of the present invention inserted within a manufacturing tube.

FIG. 3 is a perspective view of an alternative embodiment of the vacuum head used in the present invention.

FIG. 4 is an exploded view of the rotatable vacuum coupling used in the present invention.

DETAILED DESCRIPTION OF THE INVENTION

Figure 1:
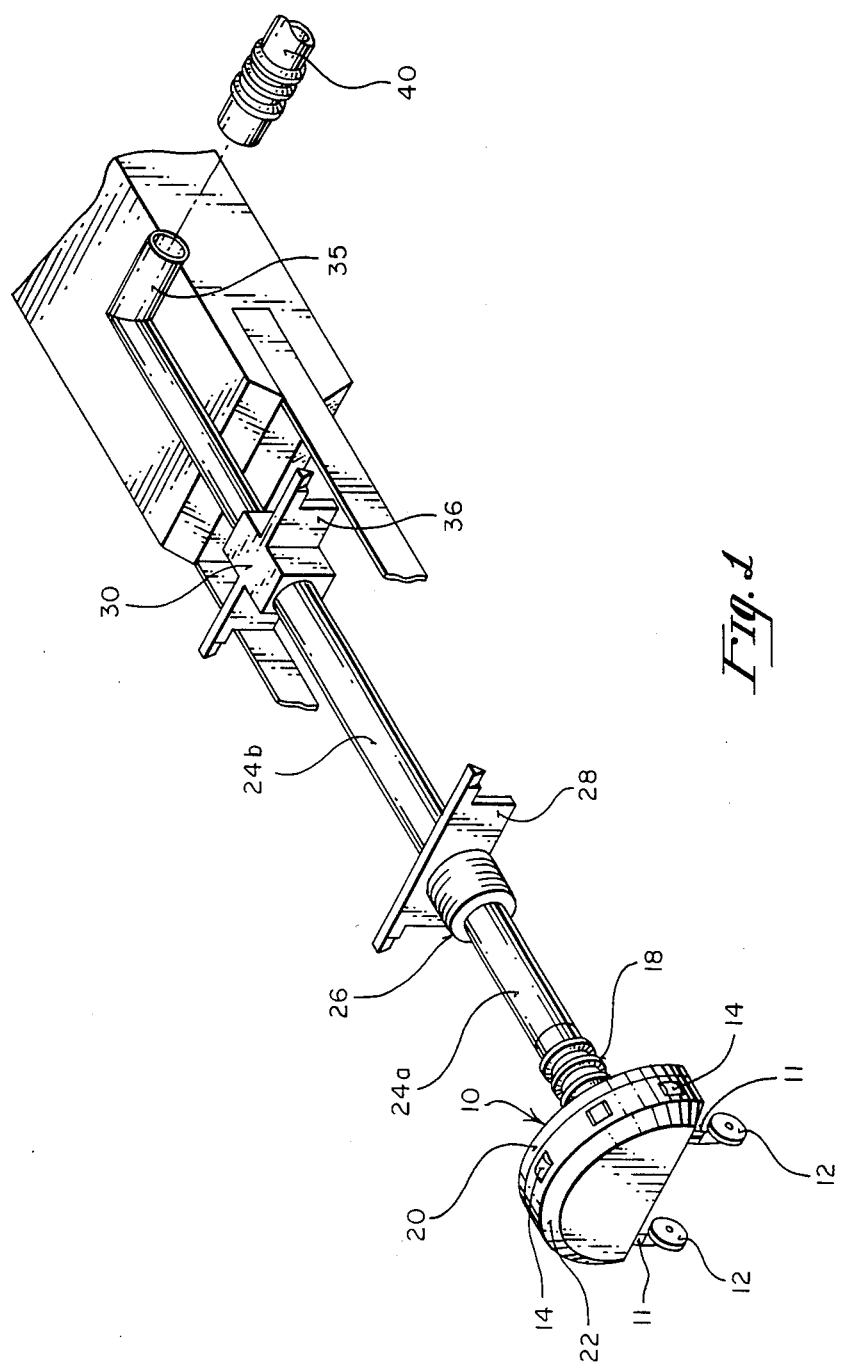
FIG. 1 is a perspective view of the preferred embodiment of the present invention.

A vacuum device having particular application for cleaning the interior surface of tubes used during the manufacture of semiconductor wafers is disclosed. In the following description, numerous construction details and specific materials are set forth in order to provide a more complete description of the present invention. In other instances, well known elements such as vacuum tubes are not described in detail so as not to unnecessarily obscure the present invention. Throughout the following specification, a description of the present invention is made with reference to process tubes which are used in the semiconductor manufacturing industry. These particular tubes are provided only as an example to more clearly show the design and use of the present invention. The present invention is not limited to use in conjunction with these particular types of tubes. It will be apparent to those skilled in the art that the spirit of the present invention encompasses a vacuum device that can be used in a wide variety of manufacturing processes.

Referring first to FIG. 1, a perspective view of the preferred embodiment of the present invention is shown. A vacuum head 10 is provided. The head is shaped to conform to the interior surface of the tube to be cleaned. In the preferred embodiment, the head is in the shape of a half circle. This shape is chosen because the tubes used in the manufacture of semiconductor devices are cylindrical. It will be evident, however, that different shapes can be used as a matter of design choice. The head 10 has attached to it two guide wheels 12 which are supported by spring mounts 11. Mounted within the surface of the head 10 are positioning wheels 14. The guide wheels 12 and spring mounts 11 work together to align the head within the tube. The guide wheels 12 rest on the lower surface of the tube, and the spring mounts 11 push the head 10 against the upper surface of the inside of the tube. The positioning wheels 14 prevent the head from actually contacting the inner surface of the tube. Instead, the head rides slightly away from the tube surface so that a gap is formed between the head and the tube. This gap allows the vacuum to suction off particles more efficiently. Without the gap, there would be no space for an airflow to enter into the vacuum head. FIG. 2 shows the vacuum head inserted within a manufacturing tube. As shown, only the guide wheels 12 and positioning wheels 14 touch the tube's surface. The gap 15 is clearly illustrated.

The guide wheels 12 and the positioning wheels 14 are both made from a non-abrasive material. As noted, guide wheels 12 and positioning wheels 14 are the only elements of the present invention which actually touch the inner surface of the tube when the vacuum device is in use. By making the wheels out of a non-abrasive material, the risk of scratching or otherwise damaging the interior of the tube is minimized. Scratches on the interior surface of the tube are undesirable because they present a greater risk of damage to the tubes. In the semiconductor manufacturing process, the tubes are typically made of quartz and heated to a high temperature during the deposition process. In the present embodiment, the wheels are made of Vespel. Vespel is a resin containing a small amount of graphite. It will be apparent to those skilled in the art, however, that different materials may be employed as a matter of design choice. The preferred material is chosen because of its ability to withstand temperatures commonly found in the semiconductor manufacturing process, and because it will not scratch the interior of the quartz tubes.

The head 10 also incorporates a vacuum slot 20. The vacuum slot in the preferred embodiment covers the entire perimeter of the arcuate portion of the vacuum head 10. Airflow can pass through the vacuum slot 20 to the vacuum tubing 24 which is attached to the head 10. When the head is in operation, particles are lifted from the surface of the tube, and travel through the vacuum slot into the tube 24. The width of the slot is chosen so as to maximize the amount of vacuum that is exerted on the interior surface of the tube. In the preferred embodiment, the total area of the vacuum slot 20 —its width times the arcuate length—is equal to 1.2 times the cross-sectional area of the vacuum tube 24.

The head 10 is connected to the rigid piece of vacuum tubing 24 by means of flexible bellows 18. Flexible bellows are chosen because they allow the head to be correctly aligned within the tube even though the vacuum tubing may not be positioned correctly with respect to the tube. Two mounting units, 28 and 36, are coupled to the tubing to support the vacuum unit while the head 10 is inserted into the tube.

The head 10 may be removed from the vacuum unit by detaching section 24a of the vacuum tubing from the rest of the unit. This is accomplished by means of retaining nut 26. The retaining nut uses a quick release design to allow the head 10 and tubing 24a to be detached. This element allows the head to be removed for cleaning or any necessary repairs. Also, alternate heads may be placed onto the vacuum tubing if it is necessary to clean tubes having different interior dimensions or different shapes.

FIG. 3 shows one such alternative vacuum head 40. In this embodiment, the head is completely circular. There are positioning wheels 41 disposed about the circumference of the head. There are no guide wheels. The vacuum slot 42 also extends along the circumference of the head 40. This embodiment may be particularly useful for circular tubes with small diameters.

The vacuum head 10 and vacuum tubing 24 may be rotated while the head is within the tube so as to allow the entire inner surface of the tube to be cleaned. A coupling means for rotatably connecting the vacuum tube 24b to the mounting means 28 is provided within coupling block 30. Referring next to FIG. 4, an exploded view of the coupling block 30 is shown. The vacuum tubing 24b is placed within the opening 31 of the coupling block 30. Bushing 33 is placed over the end of vacuum tubing 24b and held in place by means of a press fit. An O-ring seal 38 is placed within the coupling block 30 to provide a vacuum seal for the block. The O-ring 38, bushing 33, and vacuum tube 24b are held in place by cover plate 32. The cover plate is attached to the coupling block 30 by screws (not shown). In the preferred embodiment, the O-ring is made of material that is able to withstand the high temperatures normally found within the tubes used in the semiconductor manufacturing industry. The bushing 33 is made of a low friction material, such as Teflon, so that the vacuum tubing 24b may easily rotate within the coupling block 30. In the preferred embodiment, the coupling block is machined from a material such as aluminum. However, it will be apparent to those skilled in the art that alternative methods of manufacture such as injection molded plastic may be used as a matter of design choice.

Formed integrally with the coupling block 30 are one of the two support units 36 noted above. The support units consist of extended members which extend outward and away from the coupling block 30. A pair of knife edge mounts 37 are located on the peripheral edges of the members 36. These knife edges allow the vacuum device to be more easily mounted on an external stand (not shown in FIG. 4) when it is in use. Support unit 28 is similar in construction to support unit 36. However, it is not formed integrally with a coupling block. Instead, support unit 28 simply provides a point of support for the vacuum tube 24. The support units 32 and 28 act as a mounting means for mounting the entire vacuum device on the external stand.

The operational procedures of the present invention are simple. The vacuum device is placed on an external stand (not shown in FIG. 4) and supported by mounts 28 and 36. In the present embodiment, the external stand is the same device which is used to transfer the semiconductor wafers to and from the tube during the manufacturing process. The vacuum hose 40, which is connected to tubing 38 and powered to the vacuum compressor, is turned on. The vacuum device is lifted into approximate alignment with the tube and inserted into the tube. As the head 10 of the vacuum device is moved into the tube, guide wheels 12 and ramp 22 work to place the head in proper alignment with the tube surface. The ramp 22 is a slanted portion of the front side of the vacuum head as shown in FIG. 1. The guide wheels 12 and ramp 22 work as an alignment means for the vacuum head 10. The head is slowly moved along the entire length of the tube and then withdrawn. The head is then rotated 180° by means of retaining nut 26 and coupling block 30. The head is then reinserted into the tube and the remaining portion of the tube is cleaned. The vacuum device also includes a mechanical stop 35 which limits the travel of the head within the particle tube. In the present embodiment, the mechanical stop is a length of vacuum tubing which is disposed at right angles to the rest of the device. A flexible hose 40 attaches to mechanical stop 35 to connect the present invention with an external vacuum compressor. With this procedure, particles may be removed from the entire inner surface of the tube without necessitating the removal of the tube or allowing time for the tube to cool and then reheat.

Accordingly, a vacuum device having particular application in the semiconductor manufacturing process has been described. Throughout the foregoing description, the invention has been described with reference to specific exemplary embodiments. It will, however, be evident that various modifications and changes may be made without departing from the broader spirit and scope of the invention as set forth in the following claims. The specification and drawings are, accordingly, to be regarded in an illustrative rather than restrictive sense.

What is claimed is:

1. A vacuum device, comprising:
    A vacuum head;
    an alignment means connected to said head for placing said head in a predetermined position with respect to a surface to be cleaned;

a vacuum tube flexibly connected to said head;

a mounting means for supporting said tube on an external stand;

a coupling means connected to said mounting means for rotatably connecting said tube to said mounting means.

2. The device of claim 1, wherein said vacuum head has a first side, a second side, a peripheral edge and a vacuum slot disposed in said peripheral edge.

3. The device of claim 2 wherein said alignment means includes a slanted portion on said first side of said vacuum head.

4. The device of claim 2 which said alignment means comprises at least one guide wheel connected to said head and at least one positioning wheel connected to said peripheral edge.

5. The device of claim 4 wherein said guide wheels and said positioning wheels are made from non-abrasive material chosen such that it will not scratch said surface being cleaned.

6. The device of claim 4 wherein said vacuum head is coupled to said vacuum tube by means of flexible bellows.

7. A vacuum device for cleaning the interior surface of tubes used in the manufacture of semiconductor devices, comprising:

a vacuum head having a shape which substantially conforms to a shape of the inner surface of said tube;

at least one guide wheel attached to said vacuum head, said guide wheel being spring mounted;

at least one positioning wheel mounted in a peripheral edge of said vacuum head, said guide wheel and said positioning wheel being constructed and arranged so as to hold said vacuum head at a predetermined distance way from said tube;

a first vacuum tubing having first and second ends, said first end of said first vacuum tubing being flexibly coupled to said vacuum head;

a second vacuum tubing having first and second ends, said first end of said second vacuum tubing being removably coupled to said second end of said first vacuum tubing;

a rotatable vacuum coupling connected to said second end of said second vacuum tubing;

at least one mounting means coupled to said second vacuum tubing and said rotatable vacuum coupling;

a vacuum attachment means connected to said rotatable vacuum coupling for connecting said vacuum device to an external vacuum source.

8. The device of claim 7 wherein said vacuum head is in the shape of a half circle.

9. The device of claim 7 wherein said vacuum head is connected to said first vacuum tubing by flexible bellows.

10. The device of claim 7 wherein said positioning wheels and said guide wheels are made from a material which will not scratch said tube.

11. The device of claim 10 wherein said material is Vespel.

12. The device of claim 7 wherein said first and second vacuum tubings are coupled together by a quick release nut.

13. The device of claim 7 further comprising a mechanical stop for limiting the travel of said vacuum head within said tube.

14. The device of claim 7 wherein said vacuum head has formed therein a vacuum slot, and said area of said vacuum slot is a fixed predetermined multiple of an interior cross-sectional area of said tubing.

15. The device of claim 14 wherein said multiple is 1.2.

* * * * *